United States Patent
Nickel

(10) Patent No.: US 11,936,275 B2
(45) Date of Patent: *Mar. 19, 2024

(54) PUMP UNIT COMPRISING A CONNECTOR WITH SINTERED FILTER FOR PRESSURE COMPENSATION

(71) Applicant: NIDEC GPM GmbH, Auengrund OT Merbelsrod (DE)

(72) Inventor: Conrad Nickel, Troistedt (DE)

(73) Assignee: NIDEC GPM GMBH, Auengrund ot Merbelsrod (DE)

( * ) Notice: Subject to any disclaimer, the term of this patent is extended or adjusted under 35 U.S.C. 154(b) by 344 days.

This patent is subject to a terminal disclaimer.

(21) Appl. No.: 17/419,828

(22) PCT Filed: Feb. 20, 2020

(86) PCT No.: PCT/EP2020/054478
§ 371 (c)(1),
(2) Date: Jun. 30, 2021

(87) PCT Pub. No.: WO2020/173802
PCT Pub. Date: Sep. 3, 2020

(65) Prior Publication Data
US 2022/0085686 A1 Mar. 17, 2022

(30) Foreign Application Priority Data
Feb. 25, 2019 (DE) .......................... 102019104729.3

(51) Int. Cl.
*H02K 5/22* (2006.01)
*F04D 13/06* (2006.01)
(Continued)

(52) U.S. Cl.
CPC ......... *H02K 5/225* (2013.01); *F04D 13/0693* (2013.01); *H01R 13/502* (2013.01);
(Continued)

(58) Field of Classification Search
CPC ............ H01R 13/5227; H02K 5/0069; H02K 5/0213; H02K 5/10; H02K 5/225
USPC .................................................. 439/205, 206
See application file for complete search history.

(56) References Cited

U.S. PATENT DOCUMENTS

2013/0010426 A1* 1/2013 Nakano ................. H02K 11/33
361/690
2015/0208525 A1 7/2015 Negishi et al.
(Continued)

FOREIGN PATENT DOCUMENTS

DE 20 2008 001 972 U1 7/2008
DE 11 2013 004 771 T5 6/2015
(Continued)

OTHER PUBLICATIONS

Nishida et al., 'Waterproof Control Device'—Mach. Trans. (DE_102016217002_A1_I_MT.pdf), Aug. 2017 (Year: 2017).*
(Continued)

*Primary Examiner* — Kenneth J Hansen
(74) *Attorney, Agent, or Firm* — Keating & Bennett, LLP

(57) ABSTRACT

A pump assembly includes an electric motor with a printed circuit board carrying a controller, a pump driven by the electric motor, a housing surrounding the printed circuit board, and a plug connector which is fixed to an outside of the housing by a flange. The plug connector covers an opening of the housing and includes contacts directly electrically contacting the printed circuit board and passing through the opening of the housing. The connector includes a pressure compensator including a sintered filter to vent the housing.

8 Claims, 3 Drawing Sheets

(51) Int. Cl.
H01R 13/502 (2006.01)
H02K 5/10 (2006.01)
H02K 11/33 (2016.01)
H05K 5/00 (2006.01)
H05K 5/02 (2006.01)
H05K 5/04 (2006.01)

(52) U.S. Cl.
CPC ............... *H02K 5/10* (2013.01); *H02K 11/33* (2016.01); *H05K 5/0069* (2013.01); *H05K 5/0213* (2013.01); *H05K 5/04* (2013.01); *H02K 2205/09* (2013.01); *H02K 2211/03* (2013.01)

(56) References Cited

U.S. PATENT DOCUMENTS

| | | | |
|---|---|---|---|
| 2016/0190728 A1* | 6/2016 | VanZuilen | H01R 13/5202 |
| | | | 310/71 |
| 2017/0092405 A1* | 3/2017 | Manahan | H05K 7/20 |
| 2017/0171995 A1 | 6/2017 | Lee | |
| 2017/0223854 A1 | 8/2017 | Nishida et al. | |

FOREIGN PATENT DOCUMENTS

| | | |
|---|---|---|
| DE | 10 2016 205 117 A1 | 11/2016 |
| DE | 10 2016 224 469 A1 | 6/2017 |
| DE | 10 2016 217 002 A1 | 8/2017 |
| DE | 10 2016 217 002 B4 | 1/2019 |
| DE | 10 2018 103 747 A1 | 8/2019 |

OTHER PUBLICATIONS

Official Communication issued in International Patent Application No. PCT/EP2020/054478, dated May 29, 2020.
Official Communication issued in International Patent Application No. PCT/EP2020/054478, dated Aug. 25, 2021.
English translation of Official Communication issued in International Patent Application No. PCT/EP2020/054478, dated May 29, 2020.

* cited by examiner

PUMP UNIT COMPRISING A CONNECTOR WITH SINTERED FILTER FOR PRESSURE COMPENSATION

CROSS REFERENCE TO RELATED APPLICATIONS

This is a U.S. national stage of PCT Application No. PCT/EP2020/054478, filed on Feb. 20, 2020, and with priority under 35 U.S.C. § 119(a) and 35 U.S.C. § 365(b) being claimed from German Application No. 102019104729.3, filed Feb. 25, 2019; the entire disclosures of which are hereby incorporated herein by reference.

1. Field of the Invention

The present invention relates to a pump assembly.

2. Background

Water pumps often feature DC motors. The DC motors include a rotor connected to a motor shaft and rotatably mounted in a housing. The rotor is provided with permanent magnets. A stator is arranged in the rotor, which carries a number of windings on an iron core. When suitably controlled, the windings generate a magnetic field that drives the rotor to rotate. The windings are usually wound in three phases and are accordingly provided with three electrical connections via which the windings can be connected to a controller (ECU). These controllers are used in particular in the engine compartment, where they are exposed to considerable temperature fluctuations that can lead to major pressure fluctuations inside the housing. To compensate for these pressure fluctuations, semipermeable diaphragms are known from the prior art, which allow air and also water vapor to pass through the diaphragm to the outside and inside via a vent opening, but not water in liquid form. In the case of water pumps used in the engine compartments of road vehicles, there is also a requirement to protect the pumps from steam pressure generated by jets from steam pressure cleaners.

SUMMARY

Example embodiments of the present disclosure provide pump assemblies each including a connector that is as simple as possible and a venting element that is as simple as possible.

An example embodiment of a pump assembly according to the present disclosure includes an electric motor with a printed circuit board carrying a controller, a pump driven by the electric motor, a housing surrounding the printed circuit board, and a connector which is fastened on an outside of the housing by a flange which covers an opening of the housing and which includes contacts directly electrically contacting the printed circuit board which pass through the opening of the housing. The connector includes a pressure compensator to vent the housing, the pressure compensator including a sintered filter. By integrating the pressure compensator into the connector, the manufacturing process is significantly simplified. The use of a sintered filter brings a significant cost reduction compared to membranes. In addition, a sintered filter is easy to handle, making the arrangement more robust. The connector preferably includes a connection area for a terminal plug located outside the housing.

Preferably, the sintered filter is in a first opening of a vent channel extending through the connector. The vent channel preferably extends at least partially parallel to, and is spaced apart from, the contacts.

In an advantageous example embodiment of the present disclosure, the connector includes a bent base housing in which the contacts extend and which connects to the flange, the base housing including the first opening.

Preferably, the sintered filter is inserted into the first opening of the vent channel, the vent channel passes through the base housing from the first opening to a second opening, and the second opening is in the region of the opening of the housing.

In an example embodiment of the present disclosure, the base housing includes the first opening of the vent channel on a side of a bent portion of the base housing.

Preferably, the sintered filter is sealed to the connector by ultrasonic welding, laser beam welding, or bonding.

It is advantageous if the sintered filter is at least partially covered by a protective structure on the side remote from the housing. This protective structure protects the sintered filter from damage by water vapor. The protective structure can include, for example, a pot-shaped cover which include openings in its edge for venting the housing.

Preferably, the sintered filter includes sintered plastic, which has a hydrophobic effect due to extremely fine pores.

The housing is a metal housing. The housing is preferably the pump and/or motor housing. The pump assembly is preferably a water pump assembly or water pump used in a motor vehicle.

The above and other elements, features, steps, characteristics and advantages of the present disclosure will become more apparent from the following detailed description of the example embodiments with reference to the attached drawings.

BRIEF DESCRIPTION OF THE DRAWINGS

Example embodiments of the present disclosure is explained in more detail below with reference to the drawings. Similar or similarly acting components are designated in the figures with the same reference signs.

DETAILED DESCRIPTION

Figure 1:
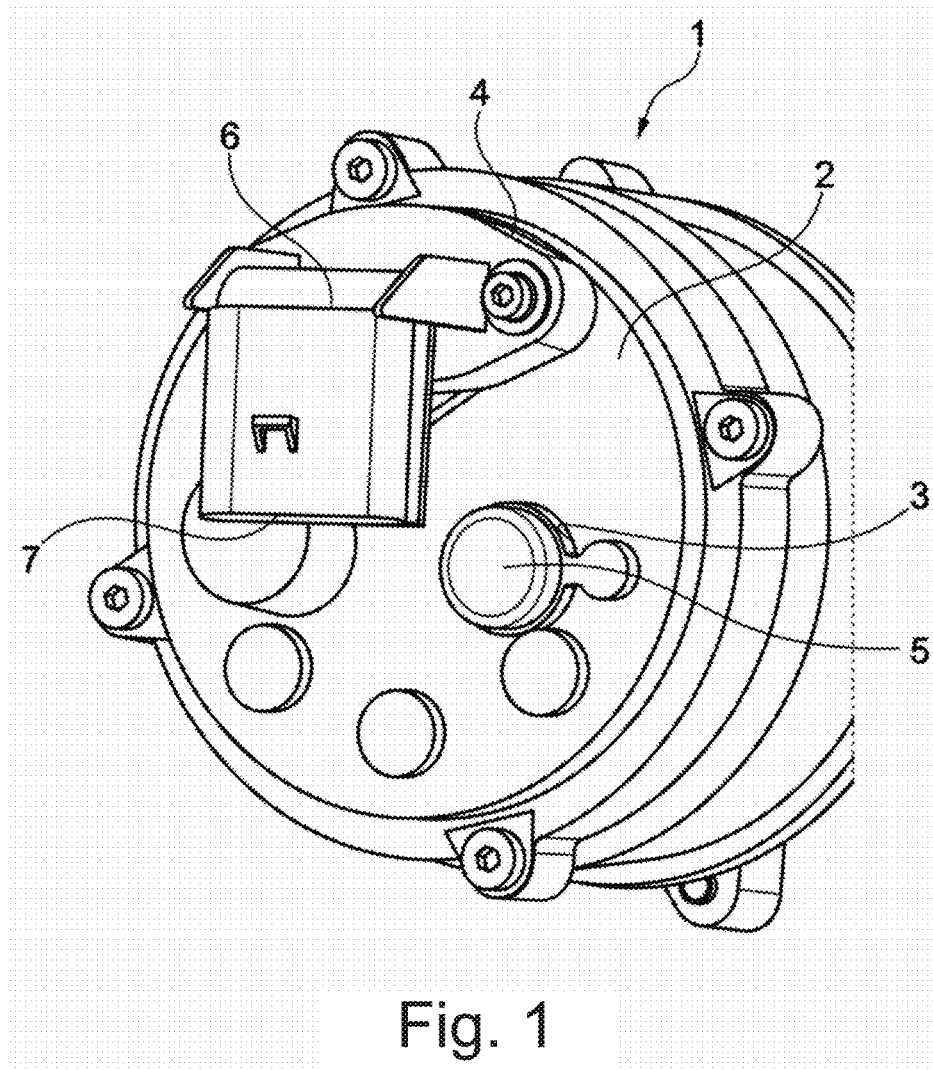
FIG. 1 is a top view of a water pump with a connector and a pressure compensation element.

FIG. 1 shows a water pump assembly 1 with a housing 2. An electric motor, a printed circuit board carrying a controller and a pump are arranged inside the housing 2. The housing 2 has two openings 3,4 on the end face near the circuit board. A diaphragm with clip is inserted into a first opening 3 to form a pressure compensation element 5. The second opening 4 is closed by a plug connector 6. The connector 6 directly contacts with its contacts the printed circuit board located inside the housing 2. For connection of the controller, the connector 6 has a connection area 7 for a connector plug not shown, which is located outside the housing 2.

Figure 2:
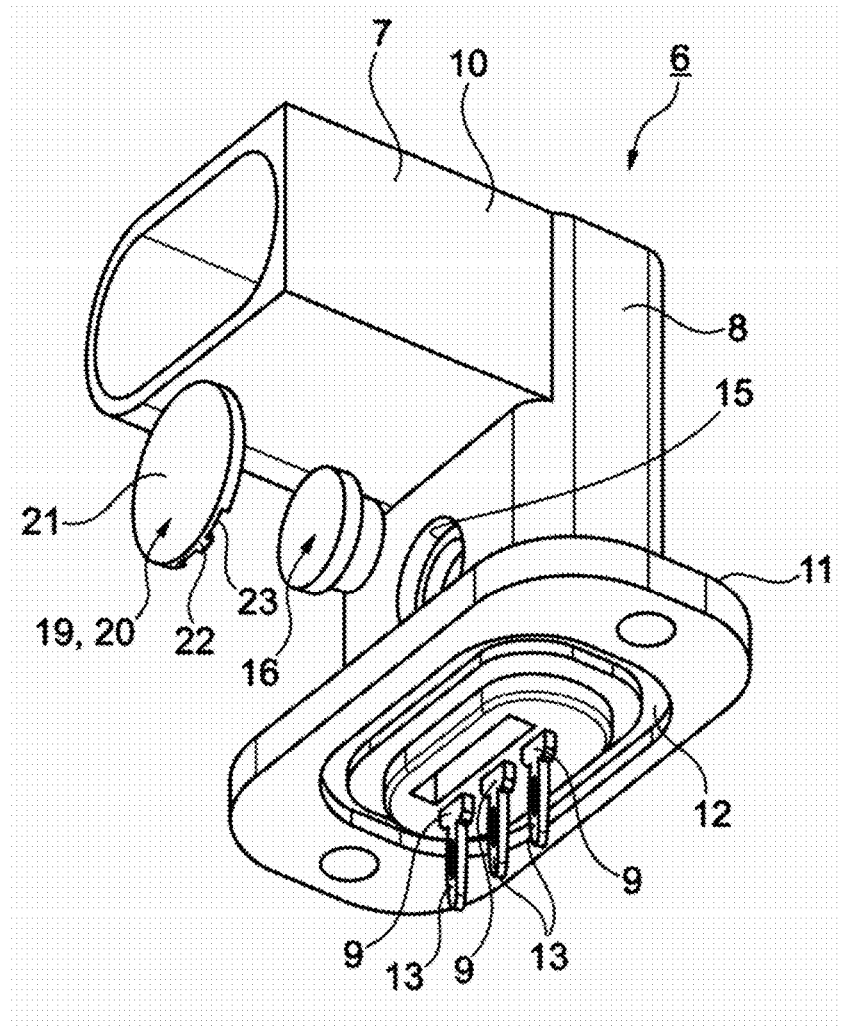
FIG. 2 is a spatial view of a connector with an exploded view of a pressure compensation element according to an example embodiment of the present disclosure.
Figure 3:
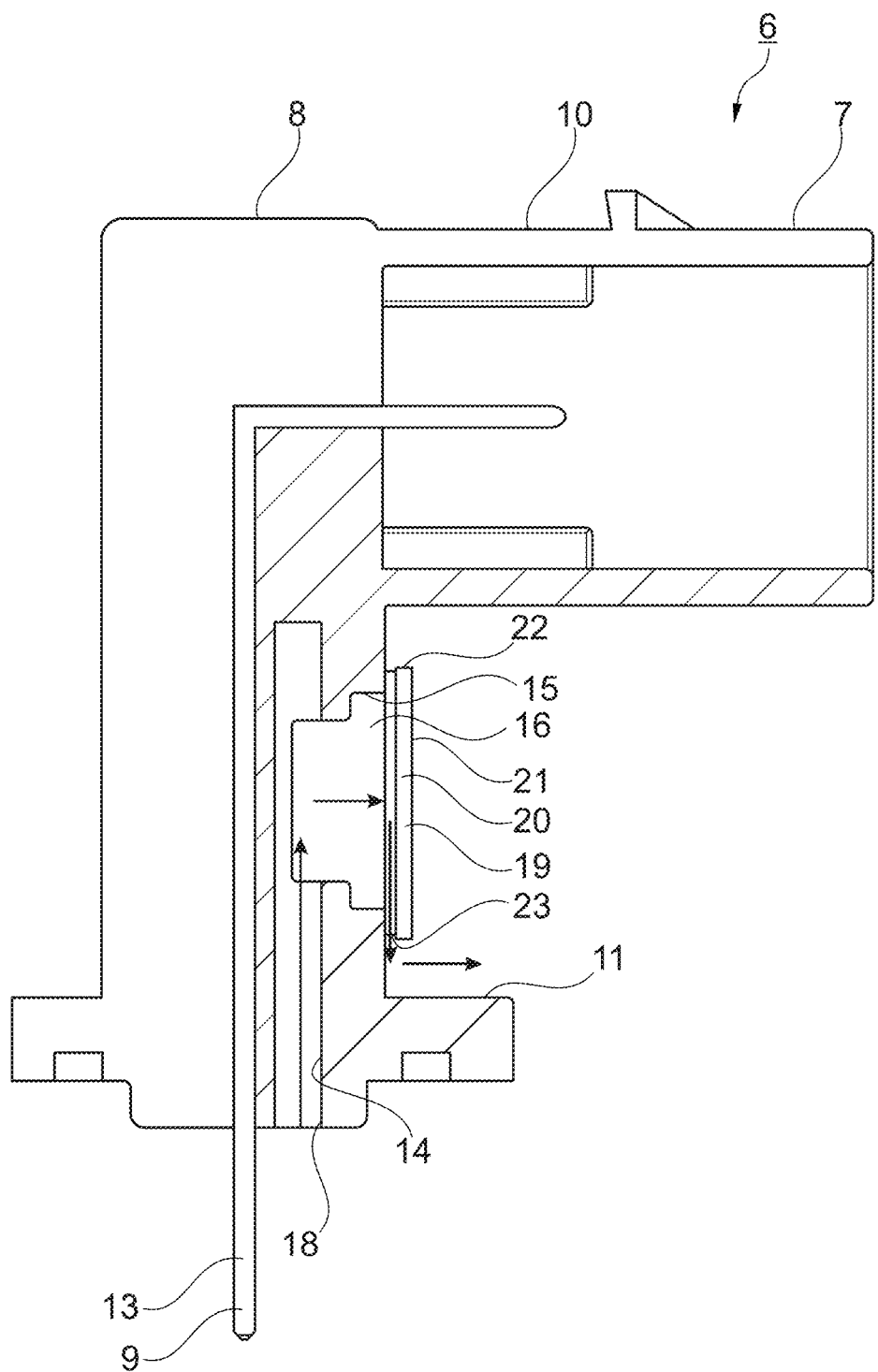
FIG. 3 is a longitudinal section through the connector of FIG. 2.

FIGS. 2 and 3 show an example embodiment of a connector according to the present disclosure, which, as previously described, electrically contacts the printed circuit board of a pump and has a connection area 7 outside the housing for a connector plug. The connector 6 has a cylindrical and rectangular, bent base housing 8. Contacts 9 extend in the base housing 8. The contacts 9 represent a conductive structure, which is preferably made of sheet copper by stamping. The contacts 9 are bent by about 90° and run radially outwards remote from the pump housing in an end region, the bend 10, parallel to the surface of the housing not shown. A flange 11 for fastening the connector 6 to the housing adjoins the base housing 8 on the side near the housing. The base housing 8 sits with its end region near the housing approximately vertically on the flange 11. The flange 11 has a closed groove 12 on its underside for insertion of a seal. Contact ends 13 project from the underside for direct electrical contact with the printed circuit board comprising the controller. The contact ends 13 are bulbously shaped pins. In particular, they are designed as press-fit pins for press-fit contacting. The end region of the base housing 8 remote from the housing is designed as a connection region 7 for a connector plug. The base housing 8 has a venting channel 14 for a pressure compensation element. The base housing 8 has a first opening 15 of the channel 14 on the side of the bend 10. The first opening 15 is closed by a sintered filter 16 for pressure compensation. The sintered filter 16 is connected to the connector 6 or the first opening 115 by ultrasonic welding, laser beam welding or adhesive bonding. As shown in FIG. 3, the vent channel 14 runs within the base housing 8 approximately parallel to and spaced from the contacts 9. The arrows shown symbolize the vent. A second opening 18 of the channel 14 is located in the flange 11, namely in the area which cooperates with the opening in the housing. The channel 15 is therefore angled by 90°.

The sintered filter 16 is at least partially covered by a protective geometry 19 on the outside. This protective geometry 19 serves to protect the sintered filter 16 from steam pressure. The sintered filter 16 is covered by a pot-shaped cover 20 with a circular base 21 for protection against steam pressure. The cover 20 is a so-called safety pad. The base surface 21 is spaced from the surface of the base housing 8 and covers the opening 15 in the base housing 8. The edge 22 of the cover 20 stands on the surface of the base housing 8 and has a plurality of elongated openings 23 which extend between the connection area 7 and the motor housing and through which venting of the pressure compensation element arranged under the cover 20 takes place. The edge 22 of the cover has a small height. The cover is glued onto the connector.

Integration of the pressure compensation element in the connector 6 reduces possible leakage points, and also reduces costs since there are fewer sealing points. In addition, the installation position of the pump assembly can be selected as desired, since the pressure compensation element is surrounded by a suitable protective geometry 19,20. The connector 6 is preferably manufactured in a single injection-molded part. The contacts 9 are overmolded with plastic during manufacture and thus are an integrated design. The housing of the pump assembly is preferably a metal housing. The housing can be the pump housing and/or the motor housing.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A pump assembly, comprising:
 an electric motor with a printed circuit board carrying a controller;
 a pump driven by the electric motor;
 a housing surrounding the printed circuit board; and
 a plug connector which is fastened on an outside of the housing by a flange, which covers an opening of the housing, and which includes contacts directly electrical contacting the printed circuit board which pass through the opening of the housing; wherein
 the plug connector includes a pressure compensator including a sintered filter to vent the housing;
 the sintered filter is at least partially covered by a protective structure on a side spaced away from the housing; and
 the protective structure includes a pot-shaped cover which includes openings in its edge to vent the housing.

2. The pump assembly according to claim 1, wherein the sintered filter is in a first opening of a vent channel which extends through the connector.

3. The pump assembly according to claim 2, wherein the connector includes a base housing which is bent, the contacts being provided in the base housing and the base housing connecting to the flange, the base housing including the first opening.

4. The pump assembly according to claim 3, wherein the sintered filter is inserted into the first opening of the vent channel, the vent channel passing through the base housing from the first opening to a second opening, the second opening being located adjacent to the opening of the housing.

5. The pump assembly according to claim 3, wherein the base housing includes the first opening of the vent channel on and adjacent to a bent portion of the base housing.

6. The pump assembly according to claim 2, wherein the vent channel extends at least partially parallel to and spaced apart from the contacts.

7. The pump assembly according to claim 1, wherein the sintered filter is connected to the plug connector by ultrasonic welding, laser beam welding, or adhesive bonding.

8. The pump assembly according to claim 1, wherein the housing is a metal housing.

* * * * *